(12) United States Patent
Shooshtari et al.

(10) Patent No.: US 8,193,106 B2
(45) Date of Patent: *Jun. 5, 2012

(54) PROCESS FOR BINDING FIBROUS MATERIALS AND RESULTING PRODUCT

(75) Inventors: Kiarash Alavi Shooshtari, Littleton, CO (US); Jawed Asrar, Greenwood Village, CO (US)

(73) Assignee: Johns Manville, Denver, CO (US)

( * ) Notice: Subject to any disclaimer, the term of this patent is extended or adjusted under 35 U.S.C. 154(b) by 1178 days.

This patent is subject to a terminal disclaimer.

(21) Appl. No.: 12/008,909

(22) Filed: Jan. 15, 2008

(65) Prior Publication Data

US 2009/0181252 A1 Jul. 16, 2009

(51) Int. Cl.
*B32B 17/02* (2006.01)
*D02G 3/00* (2006.01)

(52) U.S. Cl. .................. 442/180; 428/375; 427/385.5; 427/389.7

(58) Field of Classification Search .................. 442/180; 428/299.4, 375
See application file for complete search history.

(56) References Cited

U.S. PATENT DOCUMENTS

| | | |
|---|---|---|
| 5,143,582 A | 9/1992 | Arkens et al. |
| 5,318,990 A | 6/1994 | Strauss |
| 5,340,868 A | 8/1994 | Strauss |
| 5,427,587 A | 6/1995 | Arkens et al. |
| 5,661,213 A | 8/1997 | Arkens et al. |
| 6,136,916 A | 10/2000 | Arkens et al. |
| 6,221,973 B1 | 4/2001 | Arkens et al. |
| 6,331,350 B1 | 12/2001 | Taylor et al. |
| 6,706,853 B1 | 3/2004 | Stanssens et al. |
| 2008/0274292 A1* | 11/2008 | Shooshtari et al. ........ 427/389.8 |
| 2009/0181251 A1* | 7/2009 | Shooshtari et al. ........... 428/375 |

FOREIGN PATENT DOCUMENTS

EP 0 583 086 A1 2/1994

OTHER PUBLICATIONS

Formaldehyde-Free Crosslinking Binders for Nonwovens, Charles T. Arkens et al., Tappi Journal, vol. 78, No. 11, pp. 161-168, Nov. 1995.

* cited by examiner

*Primary Examiner* — Lynda Salvatore
(74) *Attorney, Agent, or Firm* — Robert D. Touslee

(57) ABSTRACT

A process for securely binding the adjoining fibers of a fibrous material in the absence of the use of phenol-formaldehyde reaction product is provided. A curable binding composition comprising an intermediate reaction product capable of undergoing free-radical polymerization as well as an esterification crosslinking reaction is provided. The intermediate reaction product is formed by the reaction of (i) at least one anhydride having at least one unsaturated double bond capable of undergoing free-radical polymerization, and (ii) at least one polyol crosslinker. When applied to a fibrous material, the binding composition comprising the intermediate reaction product is cured in the presence of a free-radical initiator and a polyol crosslinker wherein the double bonds present in the intermediate reaction product undergo free-radical polymerization and hydroxyl and carboxylic acid end groups undergo crosslinking to form a cured binder. In a preferred embodiment the securely bound fibrous product is fiberglass building insulation that well withstands water even at elevated temperatures.

23 Claims, No Drawings

PROCESS FOR BINDING FIBROUS MATERIALS AND RESULTING PRODUCT

BACKGROUND OF THE INVENTION

1. Field of the Invention

The subject invention pertains to an improved binding composition for use with fibrous materials. More specifically, the subject invention pertains to the use of a curable binding composition comprising an intermediate reaction product capable of undergoing free-radical polymerization as well as an esterification crosslinking reaction. When applied to a fibrous material, the binding composition comprising the intermediate reaction product is cured in the presence of the free-radical initiator and the polyol crosslinker wherein double bonds present in the intermediate reaction product undergo free radical polymerization and the hydroxyl and carboxylic acid end groups undergo crosslinking via an esterification reaction to form a cured binder for the fibrous material.

2. Description of the Related Art

Binders for fibrous materials, such as fiberglass, have a variety of uses ranging from stiffening applications where the binder is applied to woven or non-woven fiberglass sheet goods and is cured, producing a stiffer product; thermo-forming applications wherein the binder resin is applied to a sheet or lofty fibrous product, following which it is dried and optionally is B-staged to form an intermediate but yet curable product; and to fully cured systems such as building insulation.

Fibrous glass insulation products generally comprise matted glass fibers bonded together by a cured thermoset polymeric material. Molten streams of glass are drawn into fibers of random lengths and are blown into a forming chamber where they are randomly deposited as a mat onto a traveling conveyor. The fibers, while in transit in the forming chamber and while still hot from the drawing operation, are sprayed with an aqueous binder. A phenol-formaldehyde binder has been used throughout the fibrous glass insulation industry. The residual heat from the glass fibers and the flow of air through the fibrous mat during the forming operation are generally sufficient to volatilize water from the binder, thereby leaving the remaining components of the binder on the fibers as a viscous or semi-viscous high solids liquid. The coated fibrous mat is transferred to a curing oven where heated air, for example, is blown through the mat to cure the binder and rigidly bond the glass fibers together.

Fiberglass binders used in the present sense should not be confused with matrix resins which are an entirely different and non-analogous field of art. While sometimes termed "binders", matrix resins act to fill the entire interstitial space between fibers, resulting in a dense, fiber reinforced product where the matrix must translate the fiber strength properties to the composite, whereas "binder resins" as used herein are not space-filling, but rather coat only the fibers, and particularly the junctions of fibers. Fiberglass binders also cannot be equated with paper or wood product "binders" where the adhesive properties are tailored to the chemical nature of the cellulosic substrates. Many such resins are not suitable for use as fiberglass binders. One skilled in the art of fiberglass binders would not look to cellulosic binders to solve any of the known problems associated with fiberglass binders or binders for use on similar fibrous materials.

Binders useful in fiberglass insulation products generally require a low viscosity in the uncured state, yet possess characteristics so as to form a rigid thermoset polymeric mat for the glass fibers when cured. A low binder viscosity in the uncured state is required to allow the mat to be sized correctly. Also, viscous binders tend to be tacky or sticky and hence they lead to the unwanted accumulation of fiber on the forming chamber walls. This accumulated fiber may later fall onto the mat causing dense areas and product problems. A binder which forms a rigid matrix when cured is required so that a finished fiberglass thermal insulation product or similar product, when compressed for packaging and shipping, will recover to its as-made vertical dimension when installed in a building.

From among the many thermosetting polymers, numerous candidates for suitable thermosetting fiberglass binder resins exist. However, binder-coated fiberglass products are often of the commodity type, and thus cost becomes a driving factor, generally ruling out such resins as thermosetting polyurethanes, epoxies, and others. Due to their excellent cost/performance ratio, the resins of choice in the past have been phenol-formaldehyde resins. Phenol-formaldehyde resins can be economically produced, and can be extended with urea prior to use as a binder in many applications. Such urea-extended phenol-formaldehyde binders have been the mainstay of the fiberglass insulation industry for years, for example.

Over the past several decades however, minimization of volatile organic compound emissions (VOCs) both on the part of the industry desiring to provide a cleaner environment, as well as by Federal regulation, has led to extensive investigations into not only reducing emissions from the current formaldehyde-based binders, but also into candidate replacement binders. For example, subtle changes in the ratios of phenol to formaldehyde in the preparation of the basic phenol-formaldehyde resole resins, changes in catalysts, and addition of different and multiple formaldehyde scavengers, has resulted in considerable improvement in emissions from phenol-formaldehyde binders as compared with the binders previously used. However, with increasingly stringent Federal regulations, more and more attention has been paid to alternative binder systems which lack formaldehyde.

One such candidate binder system employs polymers of acrylic acid as a first component, and a polyol such as glycerine or a modestly oxyalkylated glycerine as a curing or "crosslinking" component. The preparation and properties of such poly(acrylic acid)-based binders, including information relative to the VOC emissions, and a comparison of binder properties versus urea formaldehyde binders is presented in "Formaldehyde-Free Crosslinking Binders For Non-Wovens", Charles T. Arkins et al., TAPPI JOURNAL, Vol. 78, No. 11, pages 161-168, November 1995. The binders disclosed by the Arkins article, appear to be B-stageable as well as being able to provide physical properties similar to those of urea-formaldehyde resins.

U.S. Pat. No. 5,340,868 discloses fiberglass insulation products cured with a combination of a polycarboxy polymer, a beta-hydroxyalkylamide, and at least one trifunctional monomeric carboxylic acid such as citric acid. The specific polycarboxy polymers disclosed are poly(acrylic acid) polymers. See also, U.S. Pat. No. 5,143,582

U.S. Pat. No. 5,318,990 discloses a fibrous glass binder which comprises a polycarboxy polymer, a monomeric trihydric alcohol and a catalyst comprising an alkali metal salt of a phosphorous-containing organic acid.

Published European Patent Application EP 0 583 086 AI appears to provide details of polyacrylic acid binders whose cure is catalyzed by a phosphorus-containing catalyst system as discussed in the Arkins article previously cited. Higher molecular weight poly(acrylic acids) are stated to provide polymers exhibiting a more complete cure. See also U.S. Pat. Nos. 5,661,213; 5,427,587; 6,136,916; and 6,221,973.

Some polycarboxy polymers have been found useful for making fiberglass insulation products. Problems of clumping or sticking of the glass fibers to the inside of the forming chambers during the processing, as well as providing a final product that exhibits the recovery and rigidity necessary to provide a commercially acceptable fiberglass insulation product, have been overcome. See, for example, U.S. Pat. No. 6,331,350. The thermosetting acrylic resins have been found to be more hydrophilic than the traditional phenolic binders, however. This hydrophilicity can result in fiberglass insulation that is more prone to absorb water, thereby possibly compromising the integrity of the product. Also, the thermosetting acrylic resins now being used as binding agents for fiberglass have been found to not react as effectively with silane coupling agents of the type traditionally used by the industry. The addition of silicone as a hydrophobing agent results in problems when abatement devices are used that are based on incineration. Also, the presence of silicone in the manufacturing process can interfere with the adhesion of certain facing substrates to the finished fiberglass material. Overcoming these problems will help to better utilize polycarboxy polymers in fiberglass binders.

U.S. Pat. No. 6,706,853 discloses a reaction product of a cyclic anhydride and an alkanolamine for use when binding fiberglass. Representative cyclic anhydrides include previously prepared anhydride functional polymers obtained by a free-radical polymerization of maleic anhydride with styrene and with methacrylate monomers.

It is an objective of the present invention to provide a novel process to well bind fibrous materials and the resulting bound product in the absence of the use of a phenol-formaldehyde binder.

Other objects and advantages of the invention will be apparent to those skilled in the art upon a review of the following description and appended claims.

SUMMARY OF THE INVENTION

An improved process for binding a fibrous material is provided comprising:

(a) forming a curable intermediate reaction product containing at least one unsaturated double bond capable of undergoing free-radical polymerization and hydroxyl and carboxylic acid end groups by the reaction of (i) at least one anhydride having at least one unsaturated double bond capable of undergoing free-radical polymerization, and (ii) at least one polyol crosslinker, (b) introducing a free-radical initiator and a polyol crosslinker to the intermediate reaction product, (c) applying a composition comprising the intermediate product, the free-radical initiator, and said polyol crosslinker as a coating to a fibrous material, and (d) heating the coated fibrous material in the presence of the free-radical initiator and said polyol crosslinker to achieve free-radical polymerization of unsaturated double bonds present in said intermediate reaction product as well as the crosslinking of said hydroxyl and carboxylic acid end groups via an esterification reaction while in association with the fibrous material to form a cured binder on said fibrous material.

A stable quality bound fibrous material is formed which displays good resistance to water at elevated temperatures.

In a particularly preferred embodiment the resulting fibrous material is fiberglass building insulation. In other preferred embodiments the fibrous product is a microglass-based substrate useful for a fiberglass printed circuit board, battery separator, filter stock, or reinforcement scrim.

DETAILED DESCRIPTION OF PREFERRED EMBODIMENTS

Initially at least one curable intermediate reaction product is formed which contains at least one unsaturated double bond capable of undergoing a free-radical reaction (i.e., combination with at least one other unsaturated double bond via a polymerization reaction) as well as hydroxyl and carboxylic acid end groups. Such intermediate reaction product is formed by the reaction of (i) at least one anhydride having at least one unsaturated double bond capable of undergoing free-radical polymerization, and (ii) at least one polyol crosslinker.

In preferred embodiments the anhydride having at least one unsaturated double bond is a cyclic anhydride. Representative examples of cyclic anhydrides suitable for use in the process include maleic anhydride and itaconic anhydride. An example of a non-cyclic anhydride having at least one unsaturated double bond that is suitable for use in the process is crotonic anhydride, acrylic anhydride, and methacrylic anhydride.

The polyol crosslinker utilized in the initial step of the process of the present invention when forming the curable intermediate reaction product possesses a plurality of reactive hydroxyl groups which are capable of undergoing a crosslinking reaction with the anhydride.

Representative polyol crosslinkers suitable for use when carrying out the present invention include glycols, glycol ethers, alkanolamines, polyester polyols, polyether polyols, acrylic polyols, urethane polyols, polysaccharides, polyvinyl alcohol, polypeptides, and mixtures thereof. Glycols are preferred since they are found to promote the formation of near white binder following final curing. Preferred glycols for use in the process are ethylene glycol and trimethylol propane. Other preferred polyol crosslinkers for reaction with the anhydride having at least one unsaturated double bond are diethanolamine, triethanolamine, and mixtures of these.

The intermediate reaction product commonly is formed by heating at least one anhydride having at least one unsaturated double bond and the polyol with stirring at a temperature of approximately 50 to 100° C. Reaction times of 10 minutes to 10 hours, and preferably more than 1 hour commonly are utilized. The resulting intermediate reaction product is water soluble or water dispersible and is of low viscosity when provided in water or other suitable medium which well facilitates its application to the fibrous material from an aqueous medium.

A free-radical initiator and a polyol crosslinker are introduced to the intermediate reaction product. Representative free-radical initiators include peroxides, acyl peroxides, hydroperoxides, azo initiators, peroxy esters, and mixtures thereof. Preferred free-radical initiators for use in the process are thermal free-radical initiators, and include t-butyl peroxide, cumyl hydroperoxide, and benzoyl peroxide. Radiation curable free-radical initiators also may be utilized. The polyol crosslinker that is introduced to the intermediate reaction product can be selected from among those previously identified. In preferred embodiments the polyol crosslinker for use in this step is an alkanolamine. Diethanolamine and triethanolamine, and mixtures thereof are particularly preferred dialkanolamine crosslinkers for use during the curing step of the process.

One optionally may include with the intermediate reaction product heretofore described when applied to the fibrous material one or more additional intermediate reaction product formed by the reaction of a cyclic anhydride with or without the presence of at least one unsaturated double bond capable of undergoing free-radical polymerization. The inclusion of such additional intermediate reaction product can serve to modify the properties displayed by the binder composition following curing to better serve the needs of specific end use applications. For instance, the additional aromatic rings incorporated in the components of the binder, commonly yield a higher thermal stability. Representative cyclic anhydrides which lack the presence of at least one unsaturated double bond that are suitable to react with a polyol when forming an additional intermediate reaction product include phthalic anhydride, tetrahydroterephthalic anhydride, hexahydrophthalic anhydride, 5-norbornane-2,3-dicarboxylic anhydride, norbornane-2,3-dicarboxylic anhydride, succinic anhydride, 2-dodecene-1-yl-succinic anhydride, methylsuccinic anhydride, glutaric anhydride, 4-methylphthalic anhydride, 4-methylhexahydrophthalic anhydride, trimellitic anhydride, pyromellitic dianhydride, 4-methyltetrahydrophthalic anhydride, and mixtures thereof.

Styrene maleic anhydride polymers can also be used. When used, the polymers are preferably purified to remove impurities such as cumene and acetophenone. The presence of such impurities can cause noticeable odors, which can be avoided with proper removal of the impurities.

Additionally, further crosslinking can be promoted during the subsequent curing when a polycarboxylic acid crosslinker additionally is provided with the intermediate reaction product prior to curing in the presence of the free-radical initiator as described hereafter. Representative polycarboxylic acid crosslinkers include polyacrylic acid, polymethacrylic acid, etc. The presence of such carboxylic acid end groups in greater concentrations serves to further enhance the level of crosslinking in the final product. Such further crosslinking commonly imparts even greater stability to the resulting cured product.

The size composition comprising the intermediate reaction product optionally may include further polymeric emulsion components, adhesion promoters, oxygen scavengers, solvents, emulsifiers, pigments, anti-migration aids, UV absorbers, biocides, anti-foaming agents, colorants, dyes, anti-static agents, antioxidants, etc.

The fibrous material to which the curable intermediate reaction product is applied can be provided in various configurations. The fibrous components of the fibrous material can be continuous or discontinuous. For instance, the fibers can be mineral fibers or polymeric fibers that possess sufficient thermal stability to withstand the curing of the coated fibrous material when heated as described hereafter. Representative polymeric fibers include polyethylene terephthalate fibers which are provided in the form of a spun-bonded mat. In a preferred embodiment the fibrous material comprises glass fibers, and preferably fiberglass fibers that are supplied as long multifilamentary rovings or tows of infinite length. The filament diameters can be adjusted to meet the needs of the requirements of specific end uses. In a preferred embodiment, the fibrous material is fiberglass for the production of building insulation. In other embodiments the fibrous product is a microglass-based substrate useful for a fiberglass printed circuit board, battery separator, filter stock or reinforcement scrim.

The binder composition containing the intermediate reaction product can be applied to the fibrous material as a coating by any technique capable of intimately coating the individual fibrous components thereof. For instance, when the fibrous material is provided in a continuous length, a kiss-roll applicator can be utilized.

It is essential that within the composition which includes the curable intermediate reaction product when coated on the fibrous material that a free-radical initiator be present in a concentration sufficient to achieve the substantial free-radical polymerization of unsaturated bonds present in the intermediate reaction product. It further is essential that the free-radical reaction be accomplished while the composition is in association with the fibrous material and to proceed in conjunction with the crosslinking of hydroxyl and carboxylic acid end groups via an esterification reaction. Thereby, the individual fibers of the fibrous material are securely bound to each other at cross-over points in view of the complex free-radical polymerization and crosslinking chemical reactions that simultaneously are achieved. A highly stable bound fibrous product is formed that well resists water even at elevated temperatures.

During the curing step of the process the coated fibrous material commonly is heated at a temperature of approximately 100 to 300° C. in the presence of the free-radical initiator to achieve the plurality of chemical reactions described herein. Representative curing times are approximately 1 to 40 minutes (e.g., approximately 10 to 30 minutes). If the fibrous material is a thermoplastic fibrous material, it is essential that the curing temperature that is selected not exceed the deformation or melting temperature of such fibrous material.

At the conclusion of the free-radical polymerization and crosslinking step the binder commonly is securely bound on the surfaces of the fibrous material in a concentration of approximately 1 to 25 (e.g., 5 to 6) percent by weight of the fibrous material.

The following examples are presented to provide specific examples of the invention. It should be understood, however, that the invention is not limited to specific details set forth in the examples.

Example 1

19.6 grams of maleic anhydride and 6.2 grams of ethylene glycol crosslinker are reacted with stirring for 6 hours at 90° C. to form a clear water-soluble intermediate reaction product containing unsaturated double bonds capable of undergoing free-radical polymerization and hydroxyl and carboxylic acid end groups. The intermediate reaction product is dissolved in 72 grams of a 10 percent solution of polyacrylic acid crosslinker in water. To this solution are added 0.5 gram t-butyl hydroperoxide free-radical initiator, and 15 grams of triethanolamine crosslinker with stirring to form a homogenous solution. The resulting homogeneous solution next is coated on a multifilamentary glass roving, and the coating roving is passed in the direction of its length through an air oven provided at 200° C. for 10 minutes. While present in the air oven, the coating of the intermediate reaction product undergoes a free-radical polymerization reaction of unsaturated double bonds present therein as well as crosslinking of hydroxyl and carboxylic acid end groups via an esterification reaction to form a cured binder on the surfaces of the filaments of the glass roving wherein adjoining filaments are bound at cross-over points. The resulting cured binder is stable and displays a high resistance when exposed to boiling water. The free-radical polymerization made possible in the presence of the glass roving by the free-radical initiator contributes significantly to the stability of the resulting cured binder when compared to the results obtained when the intermediate reaction product lacks the presence of the free-radical initiator.

Example 2

Example 1 is repeated wherein cumyl hydroperoxide free-radical initiator is substituted for the t-butyl hydroperoxide initiator. Substantially similar results are achieved.

Example 3

29.4 grams of maleic anhydride and 15 grams of triethanol amine crosslinker are reacted for 60 minutes at 90° C. to form a clear water-soluble intermediate reaction product containing unsaturated double bonds capable of undergoing free-radical polymerization and hydroxyl and carboxylic acid end groups. The intermediate reaction product is dissolved in 72 grams of a 10 percent solution of polyacrylic acid crosslinker in water. To this solution are added 0.7 gram cumyl hydroperoxide free-radical initiator, and 25 grams triethanolamine crosslinker with stirring to form a homogenous solution. The solution is coated on multifilamentary glass roving and is cured as described in Example 1. A free-radical polymerization reaction and a similar cross-linking reaction take place as described in Example 1. The resulting cured product is similarly stable and displays a high resistance when exposed to boiling water that is assisted by the free-radical polymerization that is made possible by the inclusion of the free-radical initiator.

Example 4

Example 3 is repeated wherein t-butyl hydroperoxide free-radical initiator is substituted for the cumyl hydroperoxide free-radical initiator. Substantially similar results are obtained.

Example 5

29.4 grams of maleic anhydride and 13.4 grams of trimethylol propane crosslinker are reacted with stirring for 10 hours at 90° C. to form a clear water-soluble first intermediate reaction product containing unsaturated double bonds capable of undergoing free-radical polymerization and hydroxyl and carboxylic acid end groups. A second intermediate reaction product is formed by the reaction of 57.6 grams of trimellitic anhydride and 13.4 grams of trimethylol propane under the same reaction conditions. The two intermediate reaction products next are dissolved with stirring in 200 grams of water containing 30 grams of triethanol amine crosslinker, and 1.0 gram of cumyl hydroperoxide free radical initiator to form a homogenous solution. The homogenous solution next is coated on a multifilamentary glass roving and is cured as described in Example 1. A free-radical polymerization reaction and a cross-linking reaction via an esterification reaction take place. The resulting cured product is similarly stable and displays a high resistance upon exposure to boiling water that is assisted by the free-radical polymerization of the first intermediate reaction product that is made possible by the inclusion of the free-radical initiator.

Example 6

Example 6 is repeated wherein cumyl hydroperoxide free-radical initiator is replaced by t-butyl hydroperoxide free-radical initiator. Substantially similar results are achieved.

Example 7

29.4 grams of maleic anhydride and 13.4 grams of trimethylol propane crosslinker are reacted with stirring for 10 hours at 90° C. to form a clear water-soluble first intermediate reaction product containing unsaturated double bonds capable of undergoing free-radical polymerization and hydroxyl and carboxylic acid end groups. A second intermediate reaction product is formed by the reaction of 45.6 grams of tetrahydrophthalic anhydride and 13.4 grams of trimethylol propane under the same reaction condition. The two intermediate reaction products next are dissolved with stirring in 200 grams of water containing 25 grams of triethanol amine crosslinker, and 1.0 gram of cumyl hydroperoxide free radical initiator to form a homogenous solution. The homogenous solution next is coated on a multifilamentary glass roving and is cured as described in Example 1. A free-radical polymerization reaction and a cross-linking reaction take place via an esterification reaction. The resulting cured product is similarly stable and displays a high resistance upon exposure to boiling water that is assisted by the free-radical polymerization of the first intermediate reaction product that is made possible by the inclusion of the free-radical initiator.

Example 8

Example 7 is repeated wherein t-butyl hydroperoxide free-radical initiator is replaced by cumyl hydroperoxide free-radical initiator. Substantially similar results are achieved.

We claim:
1. A process for binding a fibrous material comprising:
   (a) forming a curable intermediate reaction product containing at least one unsaturated double bond capable of undergoing free-radical polymerization and hydroxyl and carboxylic acid end groups by the reaction of (i) at least one anhydride having at least one unsaturated double bond capable of undergoing free-radical polymerization, which is selected from the group consisting of a cyclic anhydride, acrylic anhydride, methacrylic anhydride, crotonic anhydride, itaconic anhydride, and mixtures of the foregoing and (ii) at least one polyol crosslinker,
   (b) introducing a free-radical initiator and a polyol crosslinker to said intermediate reaction product,
   (c) applying a composition comprising said intermediate product, said free-radical initiator, and said polyol crosslinker as a coating to a fibrous material, and
   (d) heating said coated fibrous material in the presence of said free-radical initiator and said polyol crosslinker to achieve free-radical polymerization of unsaturated double bonds present in said intermediate reaction product as well as the crosslinking of said hydroxyl and carboxylic acid end groups via an esterification reaction while in association with the fibrous material to form a cured binder for said fibrous material.

2. The process of claim 1, wherein said fibrous material comprises mineral fibers.

3. The process of claim 1, wherein said fibrous material comprises glass fibers.

4. The process of claim 1, wherein said at least one anhydride having at least one unsaturated double bond is a cyclic anhydride.

5. The process of claim 4, wherein said at least one cyclic anhydride is maleic anhydride.

6. The process of claim 1, wherein two or more anhydrides are provided in admixture in step (a).

7. The process of claim 1, wherein said polyol crosslinker of step (a) is selected from the group consisting of glycols, glycol ethers, alkanolamines, polyester polyols, polyether polyols, acrylic polyols, urethane polyols, polysaccharides, polyvinyl alcohol, polypeptides, and mixtures thereof.

8. The process of claim 1, wherein said polyol crosslinker of step (a) is ethylene glycol.

9. The process of claim 1, wherein said polyol crosslinker of step (a) is diethanol amine, triethanol amine, or mixtures thereof.

10. The process of claim 1, wherein said step (a) is carried out at a temperature of approximately 50 to 100° C.

11. The process according to claim 1, wherein at the conclusion of step (a) said intermediate reaction product is water soluble.

12. The process according to claim 1, wherein during step (d) the free-radical initiator is a thermal free-radical initiator selected from the group consisting of alkyl peroxides, acyl peroxides, hydroperoxides, azo initiators, peroxy esters, and mixtures thereof.

13. The process according to claim 1, wherein during step (d) the free-radical initiator is t-butyl hydroperoxide.

14. The process according to claim 1, wherein during step (d) the free-radical initiator is cumyl hydroperoxide.

15. The process according to claim 1, wherein said polyol crosslinker of step (d) is an alkanolamine.

16. The process of claim 15, wherein said alkanolamine is diethanolamine, triethanolamine, or mixtures thereof.

17. The process according to claim 1, wherein in step (d) said heating is carried out at a temperature of approximately 100 to 300° C. to produce a cured binder in association with the fibrous material wherein adjoining fibers are bound together at cross-over points.

18. The process of claim 1, wherein a polycarboxylic acid crosslinker additionally is present during step (a).

19. The process of claim 1, wherein an alkanolamine additionally is present during step (d) which serves to further enhance crosslinking.

20. A fibrous material that is coated with a water-resistant cured binder produced in accordance with the process of claim 1 wherein adjoining fibers are bound at cross-over points.

21. A fiberglass product that is coated with a water-resistant cured binder produced in accordance with the process of claim 1 wherein adjoining fibers are bound at cross-over points.

22. A fiberglass building insulation product that is coated with a water-resistant cured binder produced in accordance with the process of claim 1 wherein adjoining fibers are bound at cross-over points.

23. A process for binding a fibrous material comprising:
(a) forming a curable intermediate reaction product containing at least one unsaturated double bond capable of undergoing free-radical polymerization and hydroxyl and carboxylic acid end groups by the reaction of (i) at least one anhydride having at least one unsaturated double bond capable of undergoing free-radical polymerization, and (ii) at least one polyol crosslinker,
(b) introducing a free-radical initiator and a polyol crosslinker to said intermediate reaction product,
(c) applying a composition comprising said intermediate product, said free-radical initiator, and said polyol crosslinker as a coating to a fibrous material, and
(d) heating said coated fibrous material at a temperature approximately 100° C. to 300° C. in the presence of said free-radical initiator and said polyol crosslinker to achieve free-radical polymerization of unsaturated double bonds present in said intermediate reaction product as well as the crosslinking of said hydroxyl and carboxylic acid end groups via an esterification reaction while in association with the fibrous material to form a cured binder for said fibrous material wherein adjoining fibers are bound together at cross-over points.

* * * * *